(12) United States Patent
Jordanov (10) Patent No.: US 7,123,176 B1
(45) Date of Patent: Oct. 17, 2006

(54) DIGITAL PEAK DETECTOR WITH NOISE THRESHOLD AND METHOD

(75) Inventor: Valentin T. Jordanov, Durham, NH (US)

(73) Assignee: Canberra Industries, Inc., Meriden, CT (US), part interest ( * ) Notice: Subject to any disclaimer, the term of this patent is extended or adjusted under 35 U.S.C. 154(b) by 836 days.

(21) Appl. No.: 10/089,923

(22) PCT Filed: Oct. 5, 2000

(86) PCT No.: PCT/US00/27501

§ 371 (c)(1),
(2), (4) Date: Apr. 4, 2002

(87) PCT Pub. No.: WO01/28101

PCT Pub. Date: Apr. 19, 2001

Related U.S. Application Data (60) Provisional application No. 60/158,559, filed on Oct. 8, 1999.

(51) Int. Cl.
*H03M 9/00* (2006.01)

(52) U.S. Cl. .................................... 341/132; 341/100

(58) Field of Classification Search ................ 341/132, 341/159, 160; 329/363
See application file for complete search history.

(56) References Cited

U.S. PATENT DOCUMENTS

| | | | | |
|---|---|---|---|---|
| 4,769,613 A * | 9/1988 | Sawata et al. | ............... | 329/363 |
| 4,827,191 A * | 5/1989 | Chapman | ................... | 341/132 |
| 5,194,865 A * | 3/1993 | Mason et al. | ............... | 341/132 |
| 5,210,538 A * | 5/1993 | Kuroiwa | ..................... | 341/160 |
| 5,254,995 A * | 10/1993 | Hantke | ....................... | 341/159 |
| 6,100,829 A * | 8/2000 | Fredrickson et al. | ........ | 341/132 |

* cited by examiner

*Primary Examiner*—Jean Bruner Jeanglaude
(74) *Attorney, Agent, or Firm*—John H. Crozier (57) ABSTRACT

A circuit and method for processing digitized analog signals ("input signals") containing noise as well as maxima and minima of input signal, whereby local peaks and valleys of the input signal are detected and captured in the presence of the noise, and whereby peak detection attributable only to noise is suppressed.

2 Claims, 11 Drawing Sheets

DIGITAL PEAK DETECTOR WITH NOISE THRESHOLD AND METHOD

CROSS-REFERENCE TO RELATED APPLICATIONS

The present application is a 35 USC 371 of PCT Application No. PCT/US00/27501, titled DIGITAL PEAK DETECTOR WITH NOISE THRESHOLD AND METHOD, which claims the benefit of U.S. Provisional Application No. 60/158,559, titled DIGITAL PEAK DETECTOR WITH NOISE THRESHOLD.

TECHNICAL FIELD

The present invention relates to digital peak detectors generally and, more particularly to a novel digital peak detector with noise threshold and method of use.

BACKGROUND ART

Radiation spectrometers perform pulse light analysis of pulse signals from a radiation detector. The pulse height is measured by detecting the peak values of the pulses. The peak detection involves two signals—peak detect and peak value. In general, the peak value is referred to the maximum of the pulse waveform. It is, however, beneficial to know both the minimal (MIN) and maximal (MAX) peak values of the signal, as is described in V. Jordanov and G. F. Knoll, "Digital Pulse Processor Using A Moving Average Technique", *IEEE Trans. Nucl. Sci.*, Vol. 40, No. 4, pp 764–769, August 1993; and H. Sawata and Y. Tomimitsu, "Digitalized Amplitude Detection Circuit For Analog Input Signal", U.S. Pat. No. 4,769,613.

The MAX peak value is used to address a channel in the spectral memory that is incremented. The increment process is initiated by the peak detect signal. In a time variant system, the peak value is the signal value when the peak detect signal becomes active. That is, the pulse waveform is sampled at the activation of the peak detect signal. A similar approach can be used with time invariant systems, but the peak value capture becomes sensitive to the time jitter of the peak detect signal.

The MIN peak value can be used to estimate the noise of the pulse waveform. This is done, for example, by averaging, MIN peak values. The average is used to set the noise threshold of the spectrometer.

Both analog and digital pulse processors use peak detectors. The analog peak detectors typically use a complex scheme of external digital signals to activate and reset the peak detector. Digital peak detectors can be built in a similar fashion but it is advantageous to implement a self-triggered peak detection scheme, as is described in Jordanov, supra, and V. T. Jordanov, "*Some Digital Techniques for Real Time Processing of Pulses from Radiation Detectors*", Ph.D. dissertation. The University of Michigan, Ann Arbor, Mich., March 1994.

Figure 1:
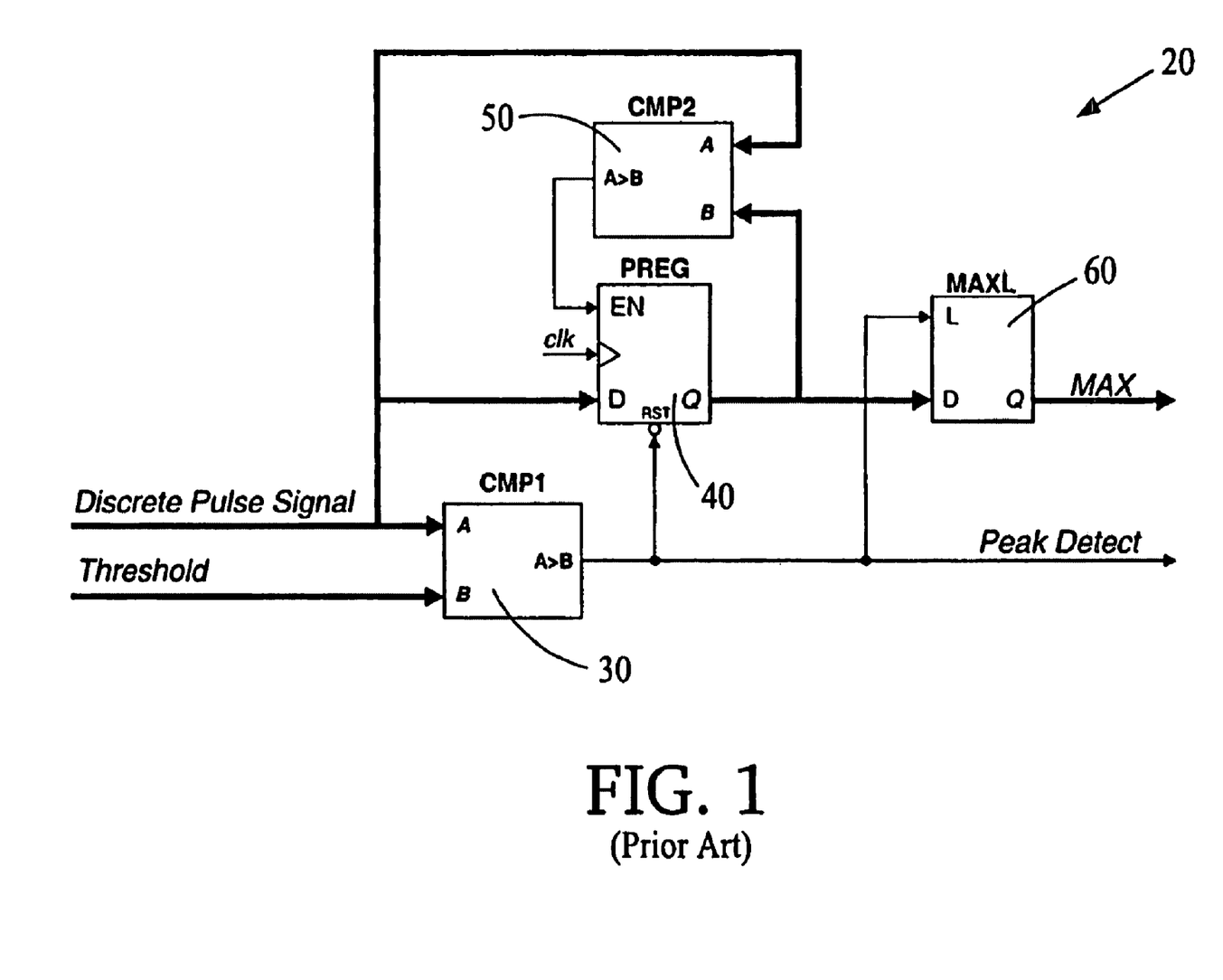
FIG. 1 is a block diagram of a conventional low-level discriminator based peak detector.

Hereafter, the pulse signal is assumed to be discrete. The pulse signal samples change at the active edge (e.g LOW-to-HIGH transition) of the system clock (CLK). In addition, for simplicity, the active state of the level signals is HIGH and the inactive state is LOW. Note that these assumptions are only for clarity and simplicity of the description A common approach to find a MAX pulse peak is to use a low-level discriminator. FIG. 1 depicts a block diagram of a low-level discriminator based peak detector. A first digital comparator CMP1 30 controls the peak detection process. The discrete pulse signal is connected to one of the inputs (A) of comparator 30, while a threshold value is applied to the other input (B). When the discrete signal is below the threshold value, the output of comparator 30 is in inactive state (LOW). When the comparator CMP1 output is inactive, peak register PREG 40 is held in reset state—the output thereof is forced to zero. A second digital comparator CMP2 50 is used to compare the output of peak register 40 with the discrete pulse signal. The output of second comparator 50 is HIGH when the pulse signal sample is greater than the PREG value. The output of second comparator CMP2 50 controls the enable input of peak register 40. When the enable signal is HIGH, the current pulse signal value at the input of peak register 40 can be stored. When the peak register is in a reset state, the enable input is disregarded.

When the discrete pulse signal exceeds the threshold, the output of first comparator CMP1 30 becomes active PREG 40 starts tracking the maximum of the discrete pulse signal. The output of PREG 40 is updated only if the current sample of the discrete pulse signal is greater than the PREG output value. When the pulse signal becomes smaller than the threshold, the first comparator CMP1 30 latches the output of PREG 40 into a latch MAXL 60 and puts peak detector 40 in a reset state. The Peak Detect signal output of first comparator CMP1 30 is the transition of the CMP1 from active to inactive state—HIGH to LOW transition.

Figure 2A:
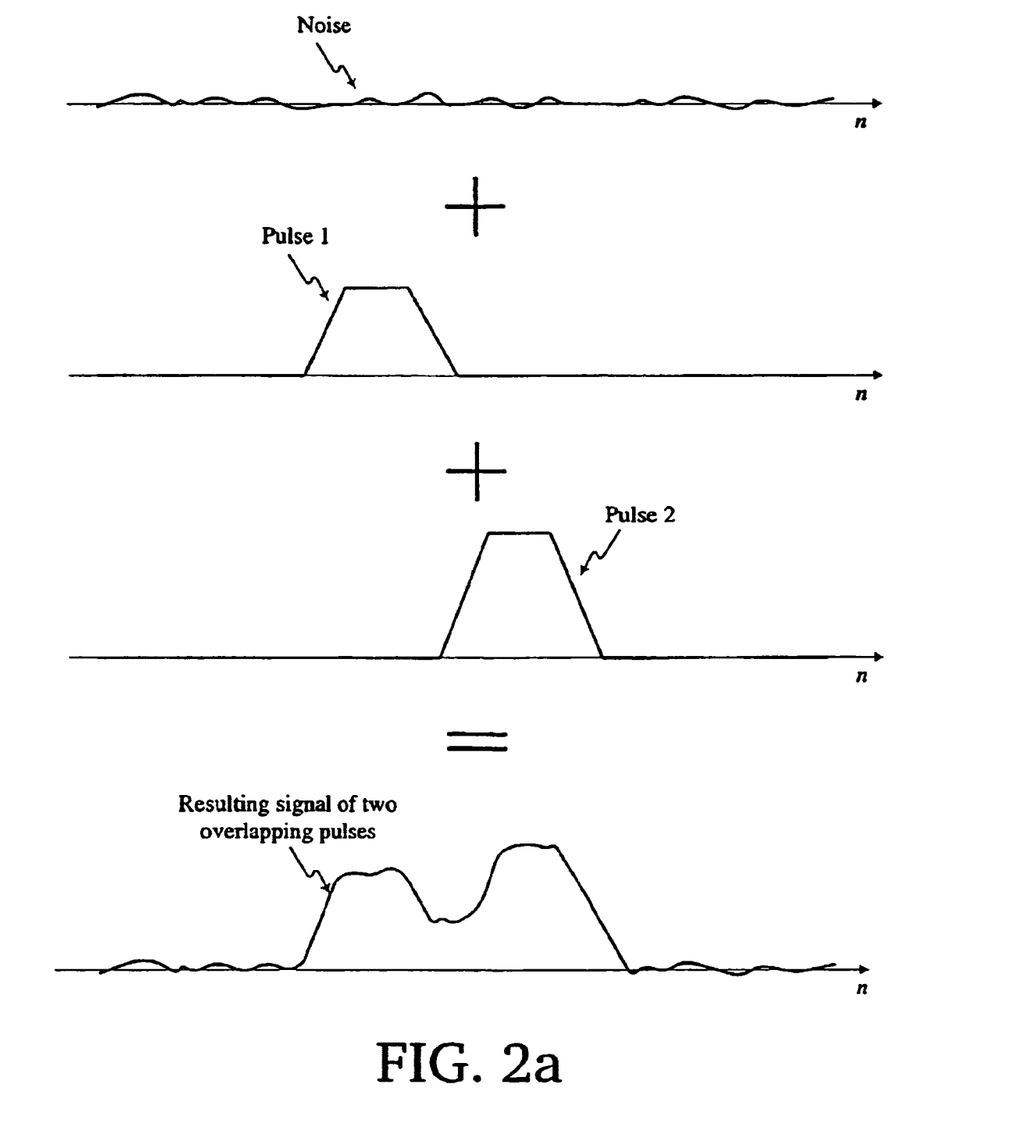
FIG. 2*a* comprises waveforms showing the resulting signal of noise plus two, partially overlapping pulses FIG. 2*b* comprises waveforms showing the operation of the peak detector of FIG. 1
Figure 2B:
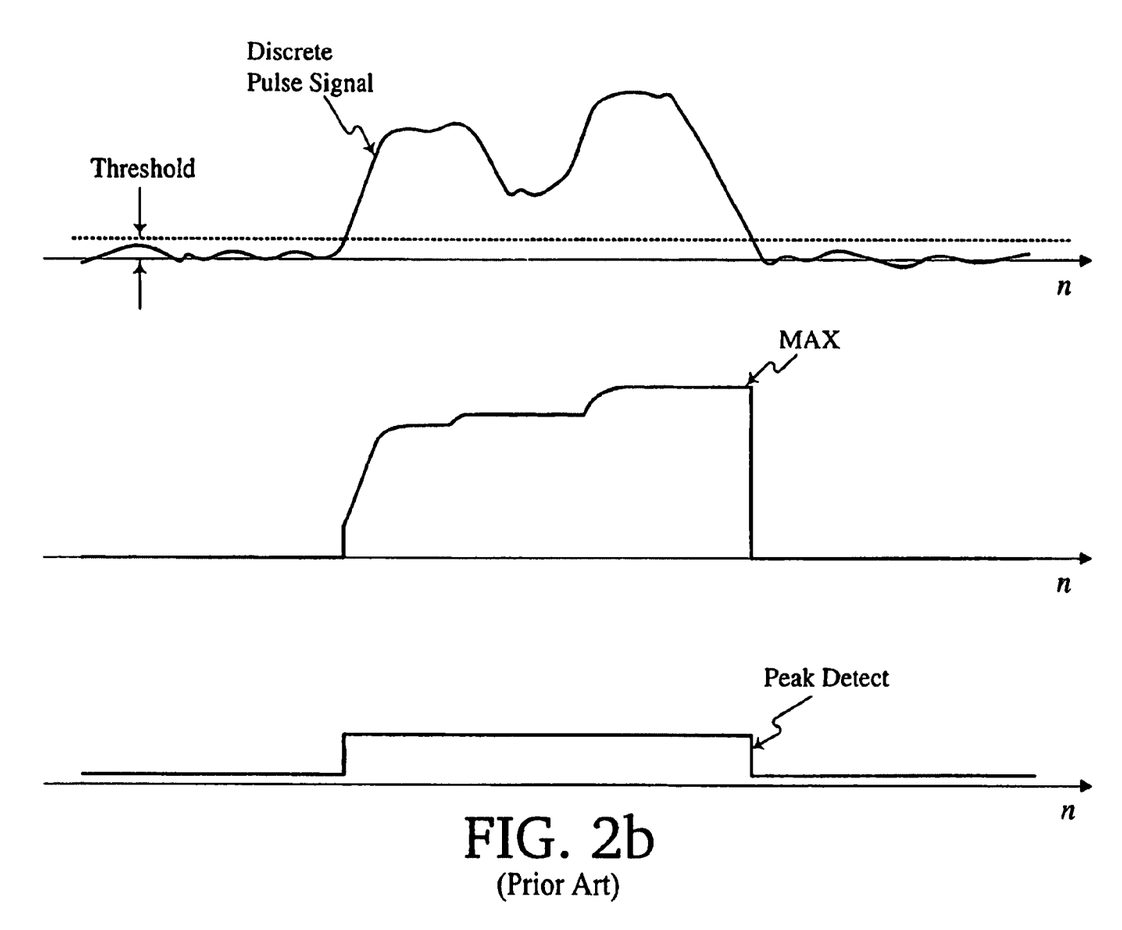

FIGS. 2a and 2b illustrate the operation of the low-level discriminator-based peak detector of FIG. 1. Two pulses that partially overlap are shown in FIG. 2a together with the noise threshold. The output of PREG 40 (FIG. 1) is shown in the second waveform in FIG. 2b. The MAX peak value that will be captured is indicated. The last waveform in FIG. 2b is the peak detect signal. It is clear that this type of peak detector detects the absolute maximum while the signal is above the threshold and FIGS. 2a and 2b illustrate a limitation of the low-level discriminator approach; namely, that only one peak over the threshold is detected, even though the resulting pulse signal comprises two pulses each having its own MAX pulse peak.

Figure 3:
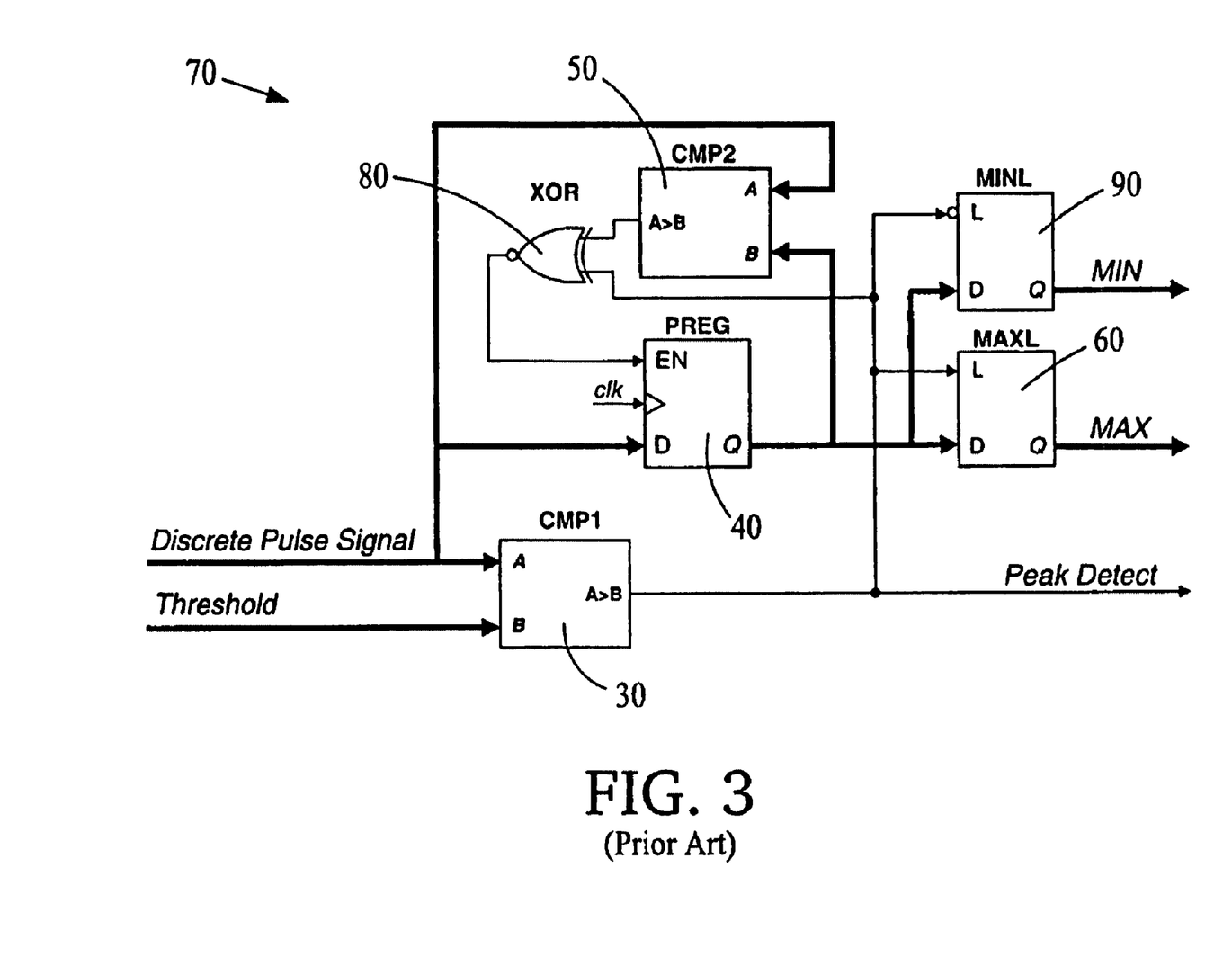
FIG. 3 is a block diagram showing a conventional modification of the peak detector of FIG. 1.

FIG. 3 shows a modified configuration of the low-level discriminator based peak detector, generally indicated by the reference numeral 70, with MAX and MIN peak values detection. PREG 40 tracks the maximum values when the output of first comparator CMP1 30 is HIGH, while the minimum values are obtained when the CMP1 is inactive. The HIGH to LOW transition of the peak detect signal indicates the capture of the MAX values. The LOW to HIGH transition of the peak detect indicates capture of the MIN detector. An exclusive OR gate receives as inputs the output signals A>B of first and second comparators 30 and 50 and provides and enables the output of PREG 40 to latch into either latch MAXL 60 or MINL 90, depending on whether MAX or MIN peak values have been detected.

Figure 4:
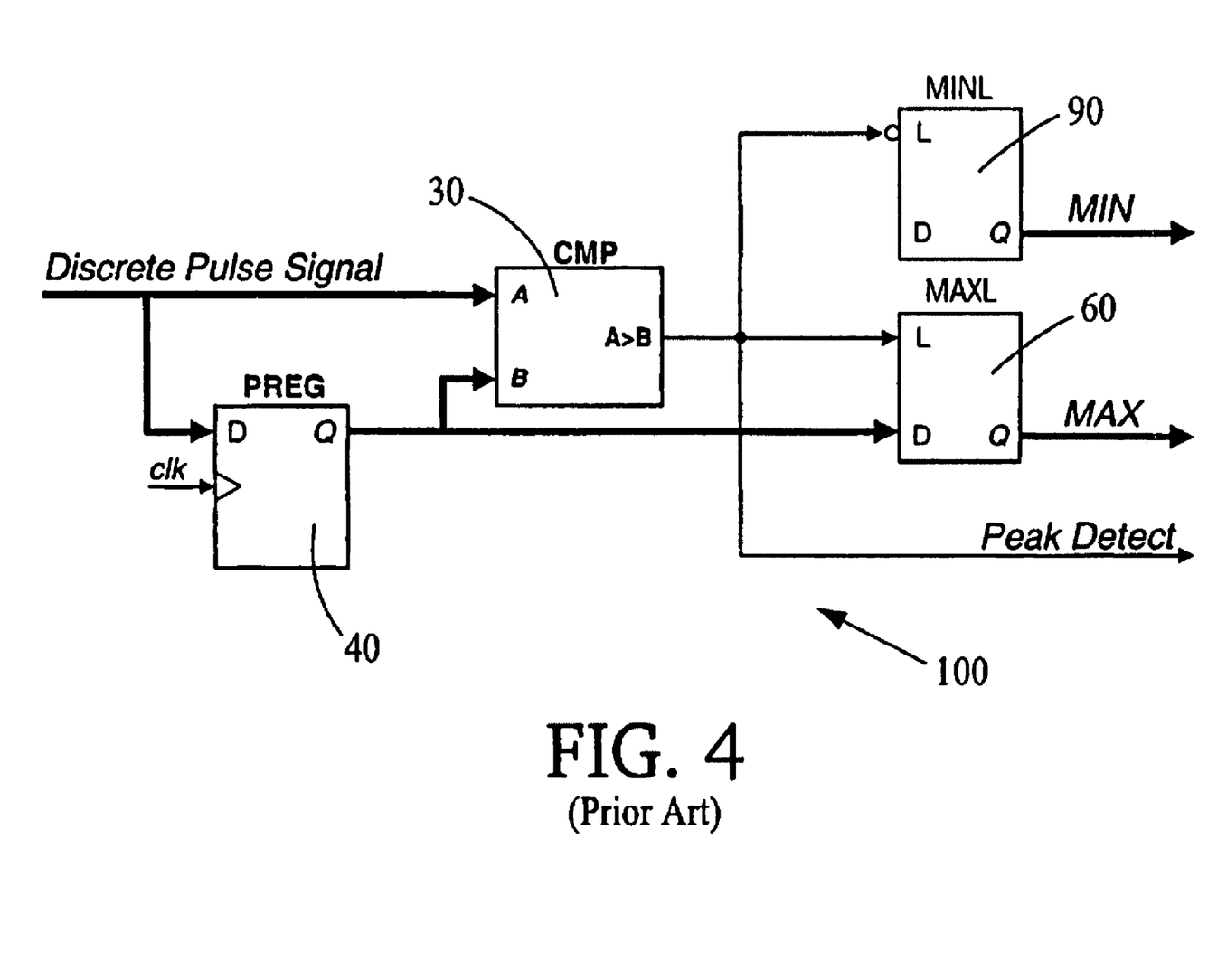
FIG. 4 is a block diagram of a peak detector using a differentiated-pulse-signal and detecting zero crossings.

Although peak detector 70 has good noise immunity, the throughput rate is reduced due to the fact that partially overlapping pulses cannot be distinguished, as was the case with low-level discriminator 20 (FIG. 1) Note that even partially overlapping the pulse amplitudes can be free of pile-up. In order to peak detect and acquire partially overlapped pulses, a peak detector capable of detecting local peaks is needed The simplest approach to detect local peaks is to use a differentiated pulse signal and detect the zero crossing, as is described in V Jordanov and G. F. Knoll, supra Depending on the direction of the zero crossing, either MAX or MIN peak values are detected. A peak detector based on this principle is shown in FIG. 4, where it is generally indicated by the reference numeral 100. When the discrete pulse signal is rising, the output of comparator CMP 30 is HIGH. As soon as the discrete pulse signal becomes zero or starts decreasing, comparator CMP 30 changes its state The HIGH to LOW transition captures the MAX peak value while the LOW to HIGH transition captures the MIN peak value.

Figure 5:
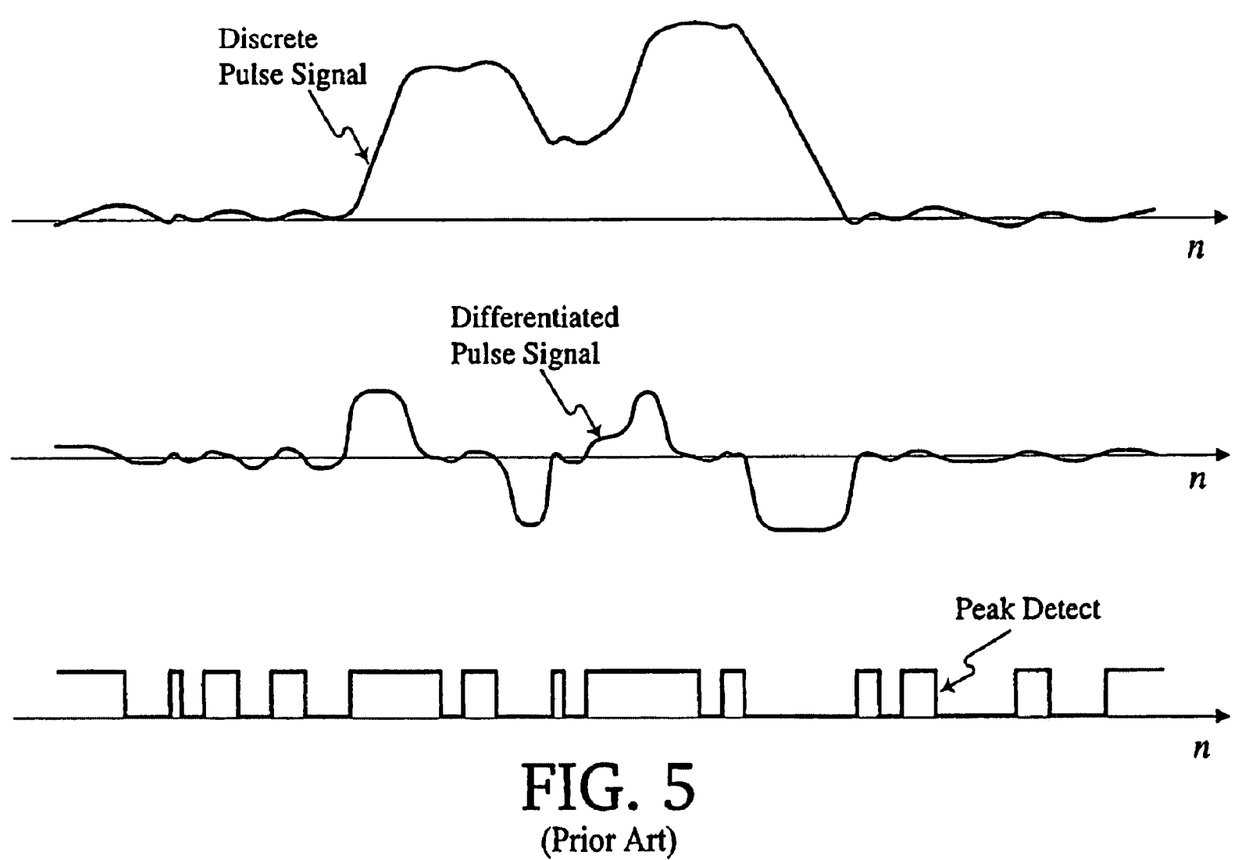
FIG. 5 comprises waveforms showing the operation of the peak detector of FIG. 4

The operation of differentiation-based peak detector 100 (FIG. 4) is illustrated with the waveforms shown in FIG. 5. The same discrete pulse signal as in the previous case is shown. The second trace shows the differentiated signal. At each crossing of the zero line, the peak-detect signal changes its state. It is obvious that the noise immunity of such detector is very poor. However, it is possible to detect local MAX and MIN values, even ones with very small amplitude.

Figure 6:
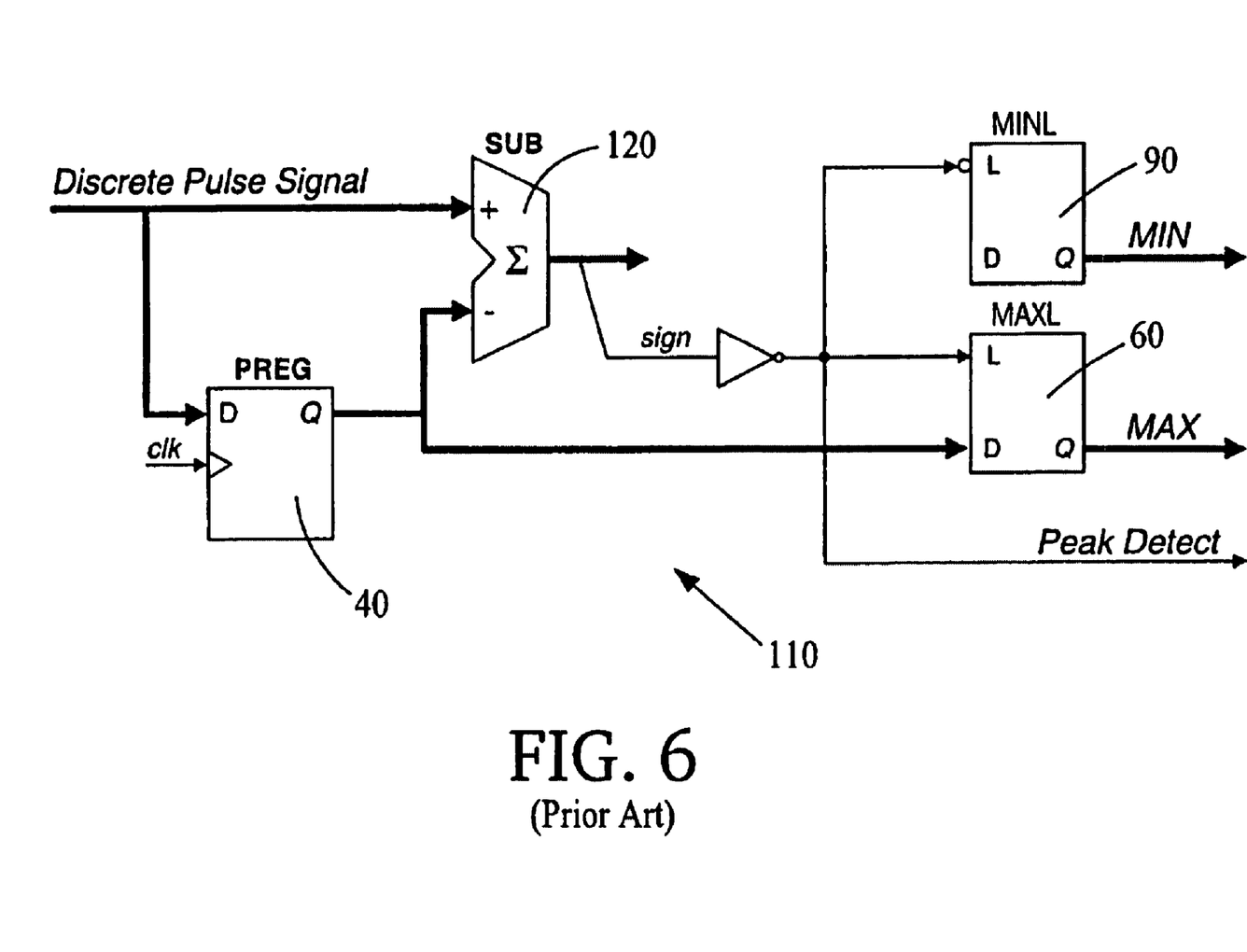
FIG. 6 is block diagram showing a conventional modification of the peak detector of FIG. 4.

A modification of peak detector 100 (FIG. 4) is shown in FIG. 6, where it is generally indicated by the reference numeral 110 In this case, the sign bit of a subtractor 120, connected to receive as inputs the output of PREG 40 and the discrete pulse signal, that actually performs the differentiation of the discrete pulse signal indicates the zero crossing. The sign output of subtractor 120 passes through an inverter 130 before serving as latching inputs to latches MAXL 60 and MINL 90. Thus, below we will consider the subtractor sign bit equivalent to a comparator greater (or less) output signal with one input of the comparator connected to zero.

There are modifications of the differential type peak detectors that use either timing or sign bit filtering techniques to improve the noise sensitivity, as described in V. T Jordanov, supra, and F Hilsenrath et al, "A single chip pulse processor for nuclear spectroscopy", *IEEE Trans. Nucl. Sci.*, Vol. 32, pp 145–149, February 1985.

Although, these methods provide improved performance, the optimal setup is difficult to realize. The timing protection is hard to predict, especially considering the timing walk and timing jitter of the circuits—they also depend on the noise level. In order to optimize the performance of the peak detector, a novel peak-detector configuration has been developed.

Accordingly, it is a principal object of the present invention to optimize the performance of a digital peak detector.

It is a further object of the invention to provide apparatus and method for detecting local maximum and minimum of a detector input signal.

It is another object of the invention to provide apparatus and method for detecting local maximum and minimum of a detector input signal with threshold and hysteresis Other objects of the present invention, as well as particular features, elements, and advantages thereof, will be elucidated in, or be apparent from, the following description and the accompanying drawing figures.

DISCLOSURE OF INVENTION

The present invention achieves the above objects, among others, by providing, in a preferred embodiment, a method of operating a peak detector, comprising: providing said peak detector; applying a discrete pulse input signal to said peak detector; and using said peak detector to detect local maxima or local minima of said input signal.

BRIEF DESCRIPTION OF DRAWINGS

Understanding of the present invention and the various aspects thereof will be facilitated by reference to the accompanying drawing figures, provided for purposes of illustration only and not intended to define the scope of the invention, on which

BEST MODE FOR CARRYING OUT THE INVENTION

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other view.

Figure 7:
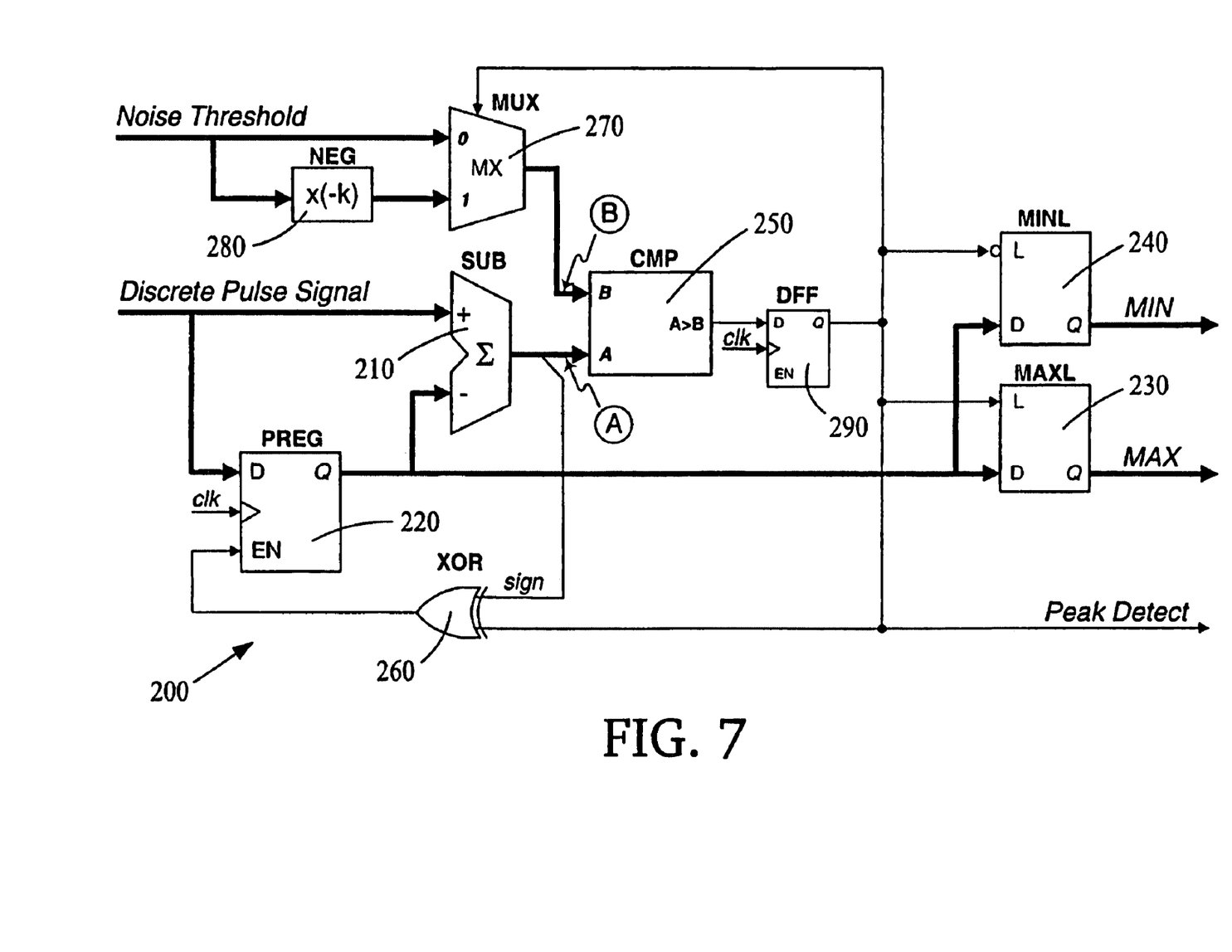
FIG. 7 is a block diagram showing a peak detector according to the present invention FIG. 8 comprises waveforms showing the operation of the peak detector of FIG. 7

A digital peak detector configuration according to the present invention is shown in FIG. 7 where it is indicated generally by the reference numeral 200. All registers and flip-flops have their clock inputs tied to the system clock clk.

The Discrete Pulse Signal is applied to a subtractor SUB 210 and to a peak register PREG 220. PREG 220 is an enable type edge triggered register. The output of PREG 220 is connected to the subtracting input of SUB 210 and the MAX and MIN peak value latches MAXL 230 and MINL 240, respectively. The output of SUB 210 is applied to one of the inputs of a comparator CMP 250 (trace A). The sign bit of the subtractor is applied to one of the inputs of an XOR gate 260 that acts as a programmable inverter The output of XOR gate 260 is applied to the enable input of the PREG 220. A Noise Threshold digital value is applied to one of the inputs of a data multiplexer MUX 270 and to the input of a negating and scaling unit NEG 280. The output of NEG 280 is applied to the other input of MUX 270. The output of MUX 270 is connected to the B input of comparator CMP 250 (B). The output of CMP 250 is applied to the D input of a d-type flip-flop DFF 290. The output of the DFF is connected to the selecting input of MUX 270, the other input of the XOR gate, and the latching inputs of MAXL 230 and MINL 240.

Figure 8:
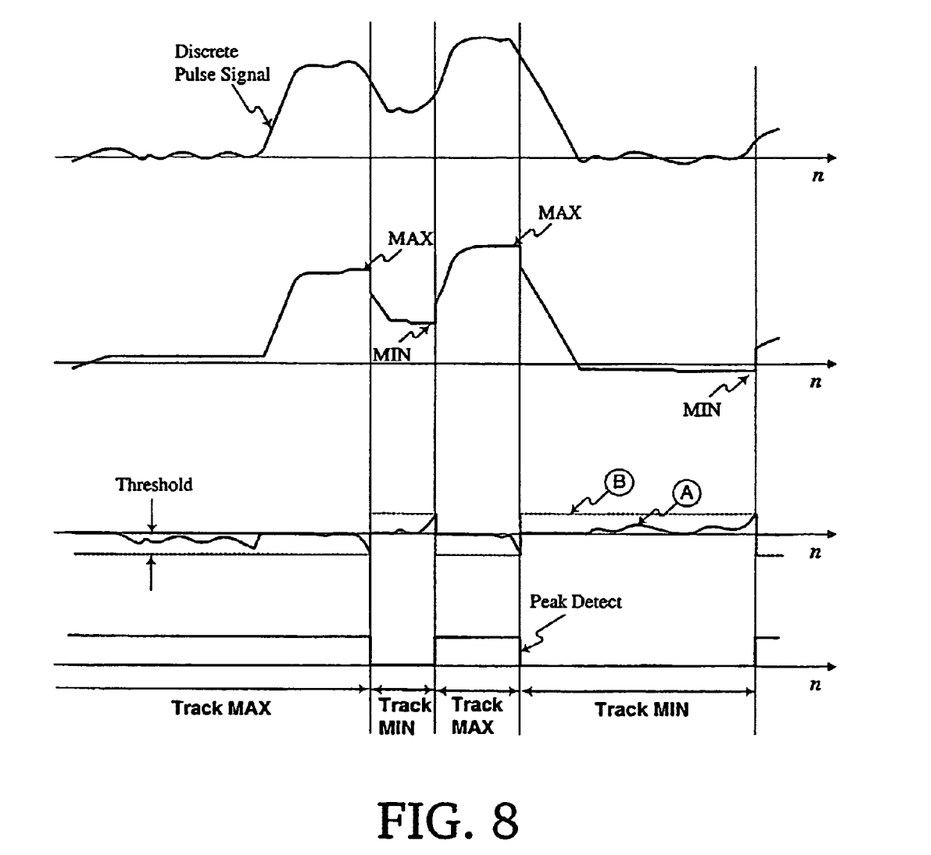

The operation of peak detector 200 (FIG. 7) is illustrated in FIG. 8. Referring to both FIGS. 7 and 8, peak detector 200 at any moment can be in one of two operating modes—tracking maximum and tracking minimum. The MIN and MAX values are detected when the peak detector changes its state The operating mode is determined by the output of DFF 290 (Peak Detect Signal)—when it is HIGH, the peak detector tracks maximum and, when LOW, the peak detector tracks minimum.

When the output of DFF 290 is HIGH, the output of MUX 270 is connected to the output of NEG 280. The value of the output of NEG 280 is the positive Noise Threshold value multiplied by k. Normally, the positive constant k is equal to one. The sign bit of SUB 210 is inverted by XOR 260. If the output of DFF 290 is HIGH and sign is LOW, then PREG 220 is enabled to capture the current Discrete Pulse Signal sample. The sign is LOW if the Discrete Pulse Signal is greater or equal to current output value of PREG 220, thus a maximum peak value tracking is achieved. If the Discrete Pulse Signal is less than the output value of PREG 20, the sign of SUB 210 is HIGH, disabling the update of PREG 220—the PREG is holding the captured maximum value. If the output of SUB 210 (CMP 250 input A) becomes smaller than the output of MUX 270 (negative threshold at the B input of the CMP), then the output of the CMP becomes zero and DFF 290 switches its state to LOW.

When the output of DFF 290 is LOW, the peak detector is tracking minimum When the output of DFF 290 becomes LOW, the digital value at the B input of CMP 250 switches from negative to the positive noise threshold XOR gate 260 allows the sign bit to pass through the XOR gate unchanged. Therefore. PREG register 220 is updated with discrete pulse samples that are less than current PREG value (sign is HIGH), allowing minimum peak value tracking. Peak detector 200 remains in a minimum tracking mode until the positive difference between the pulse signal and the output value of PREG 220 becomes greater than the value at the output of MUX 270. The output of CMP 250 becomes one and puts peak detector 200 in maximum tracking mode. The MIN and MAX peak values are latched in MAXL 230 and MINL 240 latches by the rising and falling edges of the Peak Detect signal. The same edges can be used by external electronics to initiate MIN/MAX processing routines.

Figure 9:
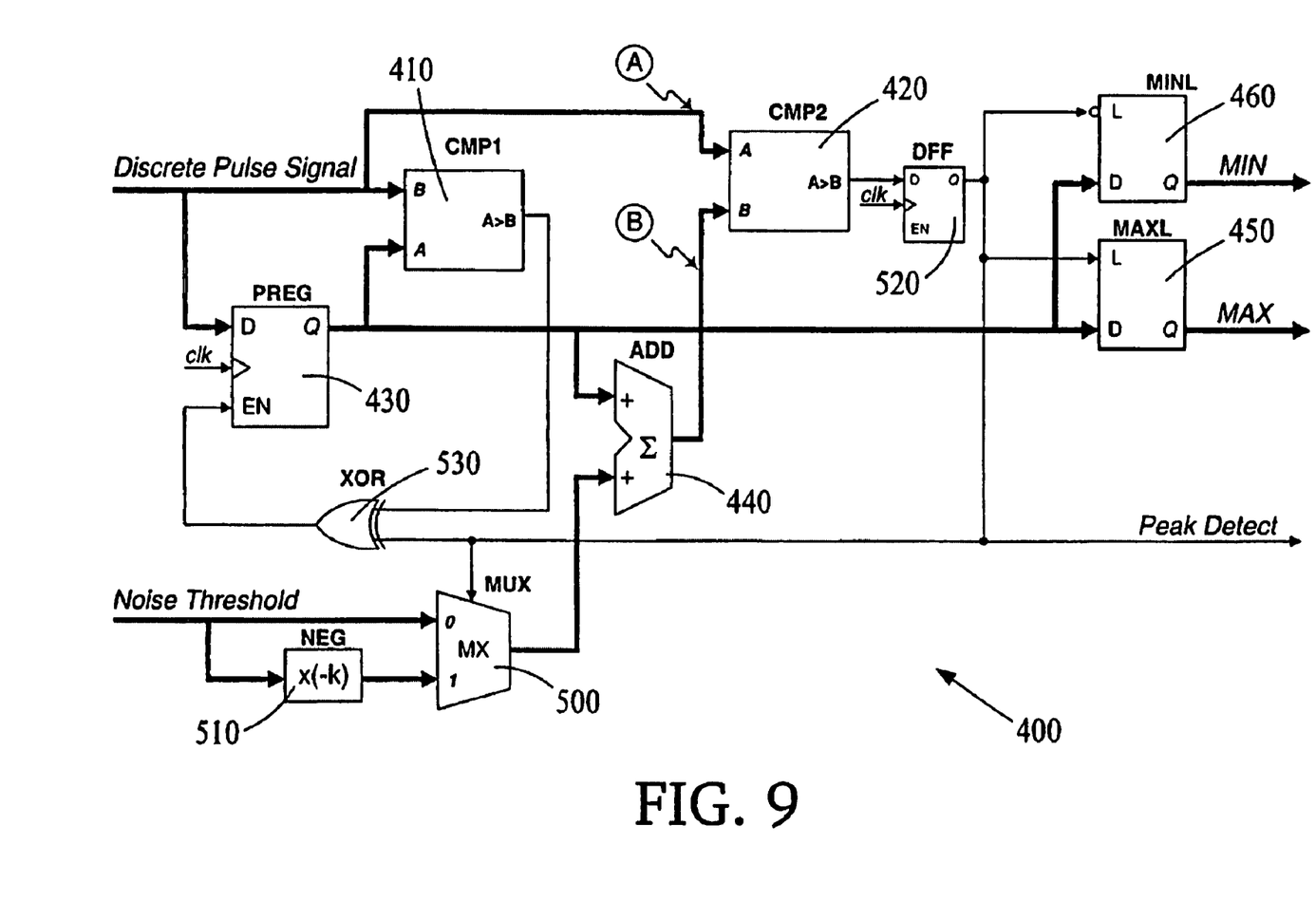
FIG. 9 is a block diagram showing a modification of the peak detector of FIG. 7

Peak detector 200 has a controllable noise sensitivity that is determined by the value of the Noise Threshold. The Noise Threshold should be set slightly above the noise level of the discrete pulse signal. The circuit exhibits a hysteresis that is equal to (k+1)*(Noise Threshold). Peak detector 200 allows peak detection of local minimum and maximum values providing high throughput capability. The configuration of FIG. 7 can be realized in different functionally equivalent arrangements FIG. 9 depicts a modified circuit arrangement of peak detector 200 (FIG. 7), the modified peak detector being indicated generally by the reference numeral 400. Here, a discrete pulse signal is applied as an input to first comparator CMP1 410 and as an input to a second comparator CMP2 420. The discrete pulse signal is also an input to the D input of peak register PREG 430. The output of PREG 430 is connected to one of the inputs of an adder ADD 440 and to the D inputs of registers MAXL 450 and MINL 460. The outputs of MAXL 450 and MINL 460 represent the maximum MAX and minimum MIN values of the signal detected between the transitions of the peak detect signal. All registers and flip-flops have their clock inputs tied to the system clock clk.

A noise threshold signal is applied to one of the inputs of a data multiplexer MUX 500 and to the input of a negating and scaling unit NEG 510. The output of MUX 500 is connected to one of the inputs of ADD 440. The output of ADD 440 is applied to the B input of CMP2 420. The output of CMP2 feeds the D input of flip-flop DFF 520. The output of DFF 520 is the peak detect signal and is applied to the latch inputs of registers MAXL 450 and MINL 460 and one of the inputs of an exclusive OR gate 530, the other input of which OR gate is the output of CMP1 410. The output of exclusive OR gate 530 is applied to the enable input of PREG 430.

Figure 10:
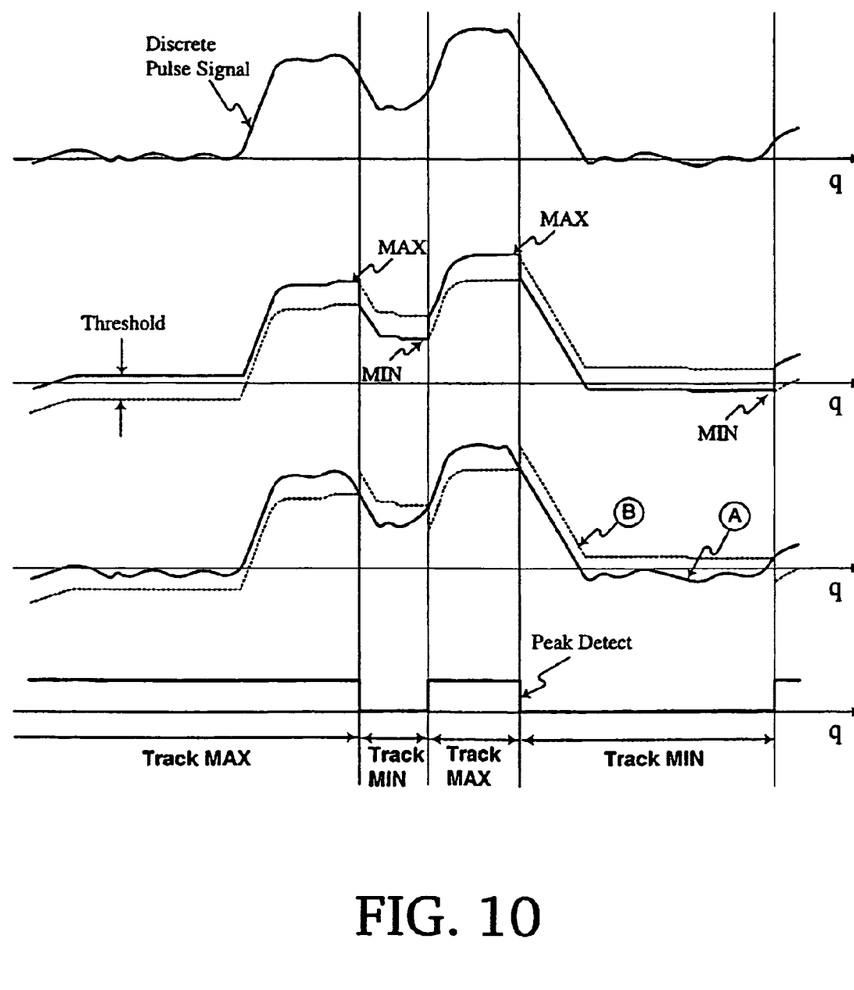
FIG. 10 comprises waveforms blowing the operation of the peak detector of FIG. 9

FIG. 10 illustrates the operation of discriminator 400 (FIG. 9). Here, suppose that initially the circuit tracks maximum (Peak Detect—HIGH). If Peak Detect is HIGH, exclusive OR gate 530 inverts the output of CMP1 410. Thus, storage in PREG 430 is enabled only when the Discrete Pulse Signal is larger or equal to the current value stored in PREG 430—a condition of tracking maximum The maximum will be tracked until the Peak Detect signal transitions to LOW When Peak Detect is HIGH, MUX 500 outputs the negated and scaled factor of k (typically k=1) Noise Threshold, The output of MUX 500 is added to the value stored in PREG 430. Therefore, in the maximum tracking mode, the output of ADD 440 (waveform B) is smaller than the tracked value at the output of PREG 430. The Peak Detect will transition from HIGH to LOW if the Discrete Pulse Signal falls below the value represented at the output of ADD 440.

When Peak Detect signal transitions from HIGH to LOW, the current value of PREG 430 is latched in MAXL 450, the output of MUX 500 connects to the Noise Threshold value (positive), and the output of CMP1 410 passes without inversion through exclusive OR gate 530 The output of ADD 440 now is higher than the value of PREG 430 by the amount of Noise Threshold. Thus, the circuit exhibits a hysteresis that is equal to (k+1)*(Noise Threshold). With the HIGH to LOW transition of the Peak Detect signal, the circuit is placed in tracking minimum mode. In this mode, PREG 430 is modified only when the Discrete Pulse Signal is smaller than the output of PREG 430. The circuit will remain in this state until the Discrete Pulse Signal becomes larger than the value at the output of ADD 440. At this point, the Peak Detect signal transitions from LOW to HIGH, latching the value of PREG 430 into MINL 460. The circuit is in maximum tracking mode and functions as described above.

In the embodiments of the present invention described above, it will be recognized that individual elements and/or features thereof are not necessarily limited to a particular embodiment but, where applicable, are interchangeable and can be used in any selected embodiment even though such may not be specifically shown.

Terms such as "upper", "lower", "inner", "outer", "inwardly", "outwardly", "vertical", "horizontal", and the like, when used herein, refer to the positions of the respective elements shown on the accompanying drawing figures and the present invention is not necessarily limited to such positions It will thus be seen that the objects set forth above, among those elucidated in, or made apparent from, the preceding description, are efficiently attained and, since certain chances may be made in the above construction and/or method without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

The invention claimed is:

1. A digital peak discriminator, comprising:
   (a) a peak register connected to receive a discrete pulse signal at its data input;
   (b) a subtractor connected to receive said discrete pulse signal at its adding input;
   (c) said peak register connected so that its output is an input to the subtracting input of said subtractor and is applied to the data inputs of maximum and minimum peak value latches;
   (d) the output of said subtractor is connected so that its output provides inputs to a comparator and to an exclusive OR gate;
   (e) said exclusive OR gate is connected so that its output is applied to the enable input of said peak register;
   (f) a noise threshold digital value is applied to one of the inputs of a data multiplexer and to the input of a negating and scaling unit, the ouput of which negating and scaling unit is applied to the other input of said data multiplexer;
   (g) said multiplexer is connected so that its output is an input to said comparator;
   (h) said comparator is connected so that its output is a data input to a flip-flop;
   (i) said flip-flop is connected so that its output is applied to the selecting input of said data multiplexer, to an input of said exclusive OR gate, and to the latching inputs of said maximum and minimum peak value latches, and provides a peak detect signal.

2. A method of tracking peaks in an input signal by means of a tracking system that can be in either a state for tracking maxima or input signal or a state for tracking minima of said input signal, said method comprising the steps of:
   (a) tracking said maxima of said input signal, continuously comparing the values of said maxima with the values of said input signal;
   (b) changing state to state for tracking minima only if and when difference between said tracked values of maxima and said values of said input signal is greater than a predetermined threshold;
   (c) simultaneously with said change of state, storing said maximum value of said input signal in a maximum holding register;
   (d) tracking said minima of said input signal until difference between said tracked values of minima and said values of said input signal are greater than a predetermined threshold; and
   (e) changing the state to state for tracking maxima, and simultaneously with said change of state, storing said minimum value of said input signal in a minimum holding register.

* * * * *